United States Patent
Dandu et al.

(10) Patent No.: US 8,778,203 B2
(45) Date of Patent: Jul. 15, 2014

(54) TUNABLE POLISH RATES BY VARYING DISSOLVED OXYGEN CONTENT

(75) Inventors: P. R. Veera Dandu, Hillsboro, OR (US); Naresh K. Penta, Potsdam, NY (US); Babu V. Suryadevara, Potsdam, NY (US); Uma Rames Krishna Lagudu, Potsdam, NY (US)

(73) Assignee: Clarkson University, Potsdam, NY (US)

( * ) Notice: Subject to any disclaimer, the term of this patent is extended or adjusted under 35 U.S.C. 154(b) by 213 days.

(21) Appl. No.: 13/118,975

(22) Filed: May 31, 2011

(65) Prior Publication Data

US 2011/0294404 A1 Dec. 1, 2011

Related U.S. Application Data

(60) Provisional application No. 61/349,347, filed on May 28, 2010.

(51) Int. Cl.
*B24B 37/00* (2012.01)
*B24B 57/00* (2006.01)

(52) U.S. Cl.
USPC ............... 216/52; 216/84; 216/89; 216/93; 451/53

(58) Field of Classification Search
None
See application file for complete search history.

(56) References Cited

U.S. PATENT DOCUMENTS

| | | | | |
|---|---|---|---|---|
| 6,007,406 A * | 12/1999 | Custer et al. | .................... | 451/36 |
| 6,082,373 A * | 7/2000 | Sakurai et al. | .................... | 134/1 |
| 6,200,196 B1 * | 3/2001 | Custer et al. | .................... | 451/41 |
| 6,206,757 B1 * | 3/2001 | Custer et al. | .................... | 451/36 |
| 6,716,802 B1 * | 4/2004 | Custer et al. | .................. | 510/108 |
| 2002/0111024 A1 * | 8/2002 | Small et al. | .................. | 438/689 |
| 2003/0029840 A1 * | 2/2003 | Custer et al. | .................... | 216/88 |
| 2003/0037697 A1 * | 2/2003 | Bian | ................................ | 106/3 |
| 2003/0077988 A1 * | 4/2003 | Gotkis | .......................... | 451/60 |
| 2003/0137052 A1 * | 7/2003 | Horiuchi et al. | .............. | 257/758 |
| 2004/0009740 A1 * | 1/2004 | Verhaverbeke | ................ | 451/42 |
| 2004/0214512 A1 * | 10/2004 | Grunwald | ........................ | 451/41 |
| 2005/0136805 A1 * | 6/2005 | Suzuki et al. | .................. | 451/41 |
| 2006/0234509 A1 * | 10/2006 | Small et al. | .................. | 438/692 |
| 2007/0051619 A1 * | 3/2007 | Mazur et al. | ................. | 204/250 |
| 2008/0119050 A1 * | 5/2008 | Shirasu et al. | ................ | 438/692 |

\* cited by examiner

*Primary Examiner* — Allan Olsen
(74) *Attorney, Agent, or Firm* — George R. McGuire; Blaine T. Bettinger; Bond Schoeneck & King, PLLC

(57) ABSTRACT

A method and system for tunable removal rates and selectivity of materials during chemical-mechanical polishing using a chemical slurry or solution with increased dissolved oxygen content. The slurry can optionally include additives to improve removal rate and/or selectivity. Further selectivity can be obtained by varying the concentration and type of abrasives in the slurry, using lower operating pressure, using different pads, or using other additives in the dispersion at specific pH values.

6 Claims, 14 Drawing Sheets

US 8,778,203 B2

TUNABLE POLISH RATES BY VARYING DISSOLVED OXYGEN CONTENT

CROSS-REFERENCE TO RELATED APPLICATIONS

The present application claims priority to U.S. Provisional Patent Application No. 61/349,347, filed on May 28, 2010, and entitled "Tunable Polish Rates by Varying Dissolved Oxygen Content," the content of which is relied upon and incorporated herein by reference in its entirety.

BACKGROUND OF THE INVENTION

1. Field of the Invention

The present invention relates to a method and system for chemical-mechanical polishing, and, more particularly, to a method and system for tunable removal rates and selectivity during chemical-mechanical polishing.

2. Description of the Related Art

During semiconductor device fabrication, the planarity required at each level of a multilevel structure is often achieved using chemical-mechanical planarization ("CMP"). CMP typically uses a chemical solution or an abrasive and a chemical slurry to remove material. The abrasive scrapes the material to remove it, while the chemical slurry reacts with the material to weaken it for removal.

During the typical fabrication process for microelectromechanical systems ("MEMS"), integrated circuits, or through-silicon via structures, one or more top layers of silicon dioxide, silicon nitride and/or polysilicon/si(100) must be polished with a dispersion that yields a very high or low polysilicon/si(100) removal rate ("RR") and a high or low selectivity over the underlying or overlying silicon dioxide, silicon nitride and/or copper layers. Both the removal rate of the undesired material and the selectivity for removal of the undesired material over the desired material are key metrics of the CMP process.

Accordingly, there is a continued need to achieve tunable removal rates and selectivities of materials commonly used in device fabrication, including but not limited to polysilicon/si(100), silicon dioxide, copper, and silicon nitride.

BRIEF SUMMARY OF THE INVENTION

It is therefore a principal object and advantage of the present invention to provide a method and system for tunable removal rates and selectivities of materials commonly used in device fabrication, including but not limited to polysilicon/si(100), silicon dioxide, copper, and silicon nitride during CMP.

It is another object and advantage of the present invention to provide a method and system for tunable removal rate selectivities using a chemical slurry and/or solution with varying dissolved oxygen content.

Other objects and advantages of the present invention will in part be obvious, and in part appear hereinafter.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
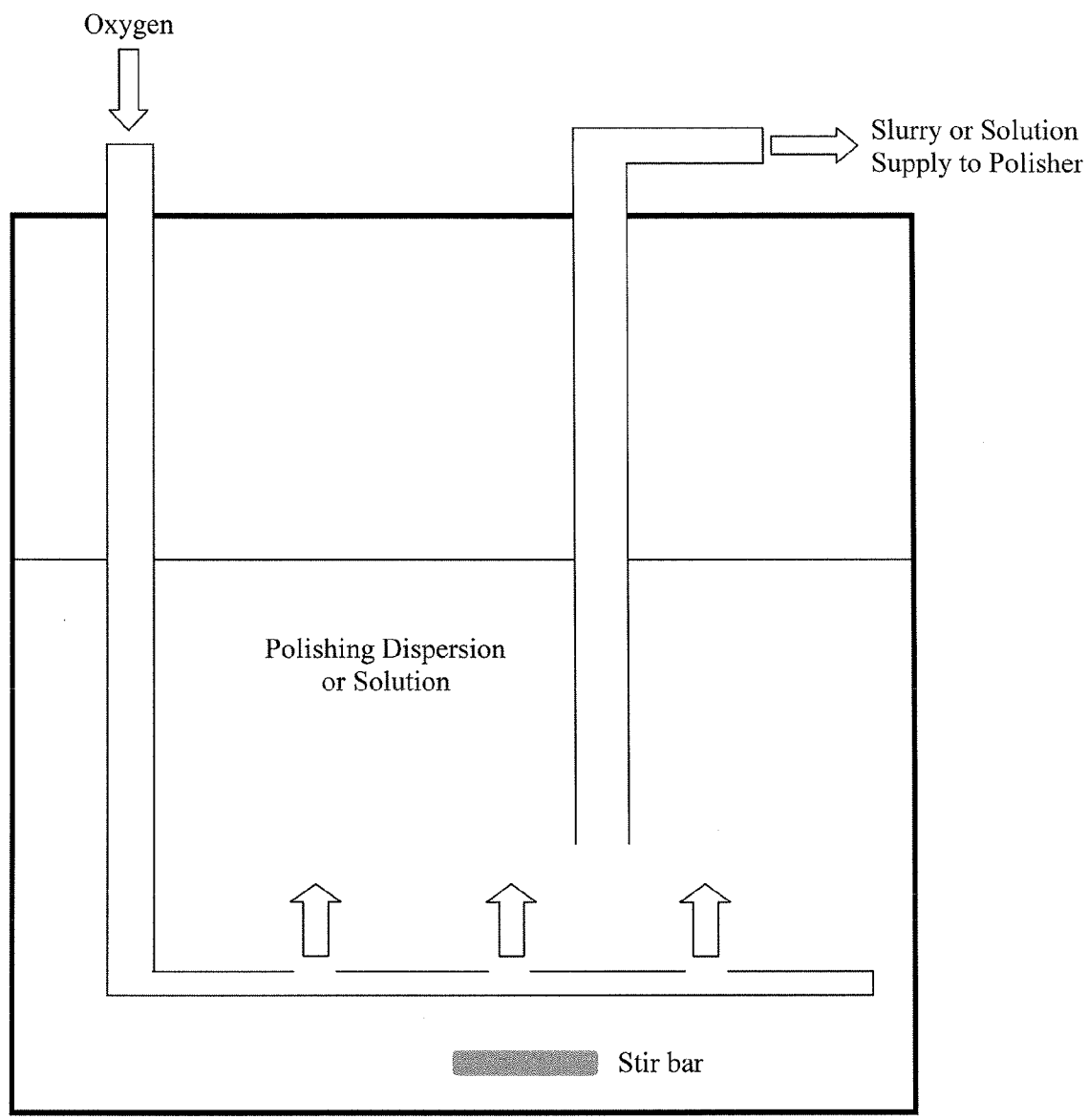
FIG. 1 is a schematic view of one embodiment of the experimental setup used to increase or maintain dissolved oxygen content.

Referring now to the drawings, wherein like reference numerals refer to like parts throughout, there is seen in FIG. 1 a schematic view of one embodiment of the experimental setup used to increase or maintain dissolved oxygen content. In accordance with one embodiment of the present invention, a method of CMP using a chemical slurry and/or solution that gives tunable RR selectivities of materials commonly used in device fabrication, including but not limited to polysilicon/si(100), silicon dioxide, copper, and silicon nitride, is provided. Using aqueous abrasive-free solutions and abrasive dispersions with additives such as alpha amine-guanidine HCl, the dissolved oxygen content ("DOC") of the solutions is increased, resulting in tunable RR selectivities of materials such as polysilicon/si(100), silicon dioxide, copper and silicon nitride.

Note that the chemical used alone or with the abrasive in the CMP process may be either a slurry or a solution. That is, the chemical may be a mixture of fluid and at least some insoluble matter (such as any of the abrasives or other functionalized or non-functionalized additives disclosed herein or known by those skilled in the art), or can be a substantially or completely homogenous mixture of two or more liquids, chemicals, and/or gasses.

In another embodiment, the invention comprises a slurry which further consists of alpha-amine functionalized silica abrasives. The selectivity provided by the current method may further be improved by varying the concentration and type of abrasives (including but not limited to silica, ceria, zirconia, titania, alumina, germania, chromium dioxide, manganese di dioxide, co-formed products thereof, and combinations thereof), using lower operating pressure, using different pads, and/or using several additives (including but not limited to amines and amino acids) in the dispersion at specific pH values.

It has previously been shown that both silicon dioxide and silicon nitride removal rates obtained using ceria-based dispersions at different pH values follow the order:

pH2<pH3<pH4~pH 10

It is proposed herein that the reactive Ce3+ species on the surface of ceria interacts with the silicon dioxide film and suboxide on the silicon nitride surface and hence, results in high removal rates of silicon dioxide and silicon nitride films. Indeed, when oxygen is bubbled through the ceria slurry at a given rate, the time required for the maximum dissolved oxygen content with pH also follows the same progression. These experiments identify the effect of anion adsorption in tuning the number of available reactive species on ceria abrasive. Both silicon dioxide and silicon nitride removal rates obtained using ceria-based dispersions decreased by increasing the concentration of anions ($NO_3^-$, $Cl^-$) in the ceria-based dispersions. Based on zeta potential, TGA and pKa data, it seems that the binding of these anions on the ceria abrasive surface is purely due to electrostatic interactions. The dependence of anion adsorption and the consequent effect on silicon dioxide and silicon nitride removal rates on pH values are also analyzed below.

Ceria is well known for its oxygen storage capacity and release depending upon its ambient conditions. In addition, ceria has a unique property to shift easily between reduced and oxidized stated ($Ce^{3+} \leftrightarrow Ce^{4+}$). Due to these specific properties, ceria is used as a catalyst or a supporting material for catalyst in several industrial processes like automotive catalytic convertors, water-gas shift reactions at lower temperatures, production and purification of hydrogen, etc. Besides these applications, ceria particle-based dispersions are widely used to planarize silicon dioxide and/or silicon nitride films in chemical mechanical planarization (CMP) during integrated circuit and micro-electro mechanical system fabrications.

It is also well known that ceria has strong chemical affinity towards silicon dioxide. Several models have been proposed to explain the removal mechanism of silicon dioxide during CMP. For example, it has been proposed that the hydrated layer on ceria forms Ce—O—Si bonds with silicon dioxide surface. Since Ce—O—Si structures are much stronger than Si—O—Si structures in the silicon dioxide matrix, they were ruptured due to the relative motion between pad and silicon dioxide surface during polishing. Later, as an extension to this model, another group proposed that the silicon dioxide molecules are removed as "lumps" rather than as individual entities or as oligomers of water soluble $Si(OH)_4$.

More recently, based on spectroscopy data, we proposed that the $Ce^{3+}$ on the surface of the ceria abrasives is the reacting species that interacts with silicon dioxide or the suboxide on the silicon nitride surfaces forming Ce—O—Si structures. Also, we found that both the silicon dioxide and silicon nitride removal rates varied proportionally to the number of the reactive $Ce^{3+}$ sites on the surface of ceria abrasives in the pH range 2-12. However, silicon nitride RRs were lower when compared to the silicon dioxide RRs in the pH range 3-12 since the silicon nitride removal is a two-step process, unlike silicon dioxide removal, with hydrolysis reaction i.e., formation of the suboxide as the rate determining step.

In our earlier publications, we showed that the silicon dioxide and silicon nitride RRs obtained using ceria-based dispersions at pH ~2 is very low compared to the RRs in the pH range 3-10. Generally pH of the slurry is adjusted to the acidic range using $HNO_3$ or a similar acid. In this work, it is shown that the anions from the pH adjusting agents play a significant role in tuning the removal rates of both silicon dioxide and silicon nitride films. Based on the zeta potential, UV-visible absorbance, and oxygen intake and release data, it seems that this decrease in the removal rates in the presence of different anions at different pH values is due to the blockage of the reactive $Ce^{3+}$ on the surface of the ceria abrasive, confirming our earlier proposed mechanism.

Therefore, the $Ce^{3+}$ on the surface of the ceria abrasives controls the removal rates of silicon dioxide and silicon nitride films. The polishing experiments, described in detail below, show that the anion from the pH adjusting agent also has a significant contribution to the observed reduction the RRs of $SiO_2$ and $Si_3N_4$. Zeta Potential, TGA and pKa data suggest weak electrostatic interactions between the anions of the salt and the active $Ce^{3+}$ species present on the surface of the abrasives. The DOC measurements when oxygen is bubbled to ceria dispersions were found to follow a similar trend with respect to pH as the RRs of $SiO_2$ and $Si_3N_4$. These measurements also indicate that the active species present on the surface of Ceria is $Ce^{3+}$ and they may be converted to $Ce^{4+}$ when the ambience is oxygen rich in state.

Example 1

Functionalizing Silica Particles

Figure 2:
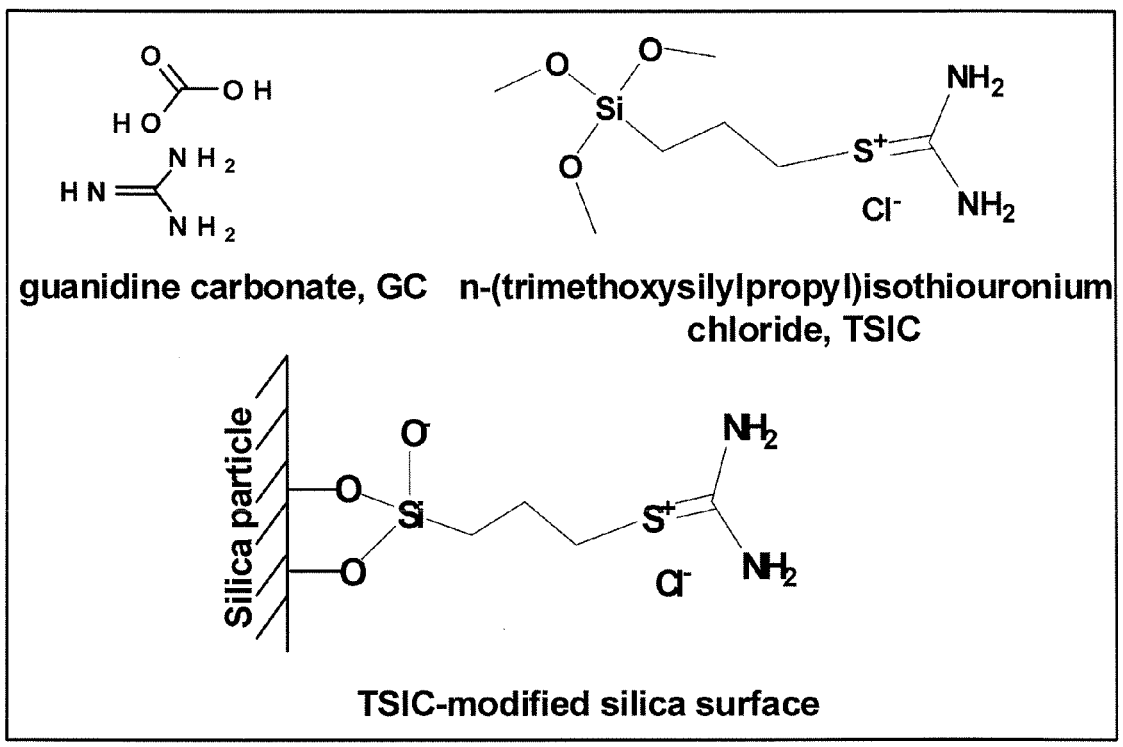
FIG. 2 is the molecular structure of guanidine carbonate and n-(trimethoxysilylpropyl)isothioronum chloride ("TSIC"), and a representative schematic of a TSIC-modified silica particle according to one embodiment of the present invention.

To functionalize silica particles for the experiments, 30 wt % silica nanoparticles dispersed in IPA were mixed with a known amount of TSIC and continuously stirred at 900 rpm using a mechanical agitator and maintained at ~80° C. with a continuous reflux for 5 hours. The unreacted TSIC was removed from the reacted dispersion by subjecting it to several cycles of dialysis (using a tubular membrane) in water till the absence of TSIC in water was confirmed by a drop in its conductivity (measured using an Oakton PC 510 conductivity meter) to its initial value. Then the dispersion was diluted with deionized water to lower the particle loading to 15 wt %. Finally, methanol formed during this procedure along with the dispersant IPA was removed from the reacted dispersion using a rotovap. The chemical structure of a TSIC-modified silica particle according to one embodiment of the present invention is shown in FIG. 2.

Figure 3A:
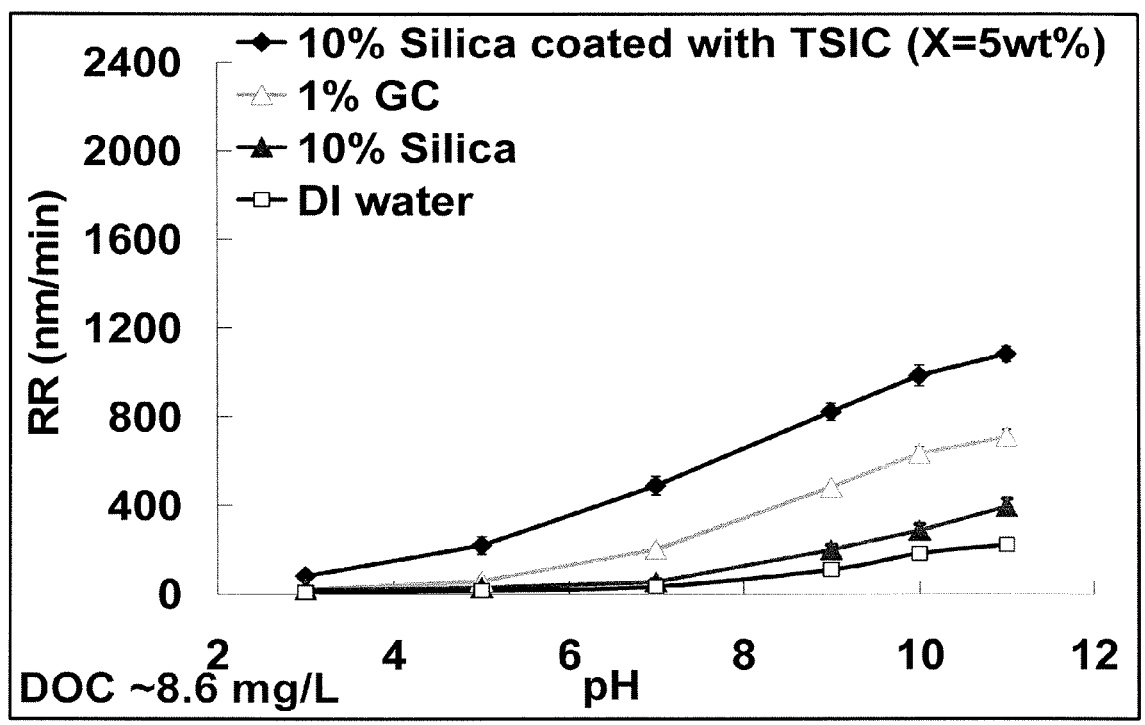
FIG. 3A is a graph of the removal rate of polysilicon films using abrasive-free solutions and silica-based dispersions as a function of pH at a dissolved oxygen content of ~8.6 mg/L.
Figure 3B:
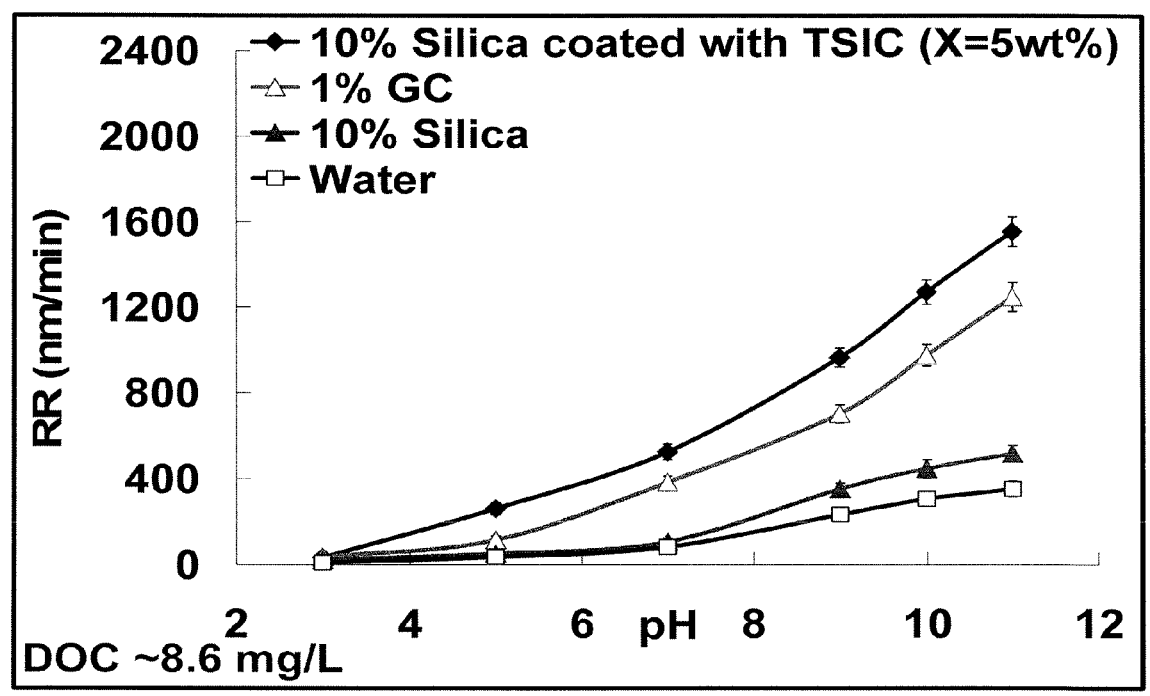
FIG. 3B is a graph of the removal rate of Si(100) films using abrasive-free solutions and silica-based dispersions as a function of pH at a dissolved oxygen content of ~8.6 mg/L.

FIGS. 3A and 3B depict polysilicon and Si(100) removal rates, respectively, obtained with pH-adjusted water, 1 wt % guanidine carbonate ("GC") aqueous solution, 10 wt % unmodified and TSIC-modified silica dispersions at different pH values at the initial DOC ~8.6 mg/L. In all these four cases, both polysilicon and Si (100) RRs increased as a function of pH and the order of increase follows the progression shown below:

Modified silica abrasives>GC>silica abrasives>water

Example 2

Removal Rates for Polysilicon and Si(100)

Figure 4A:
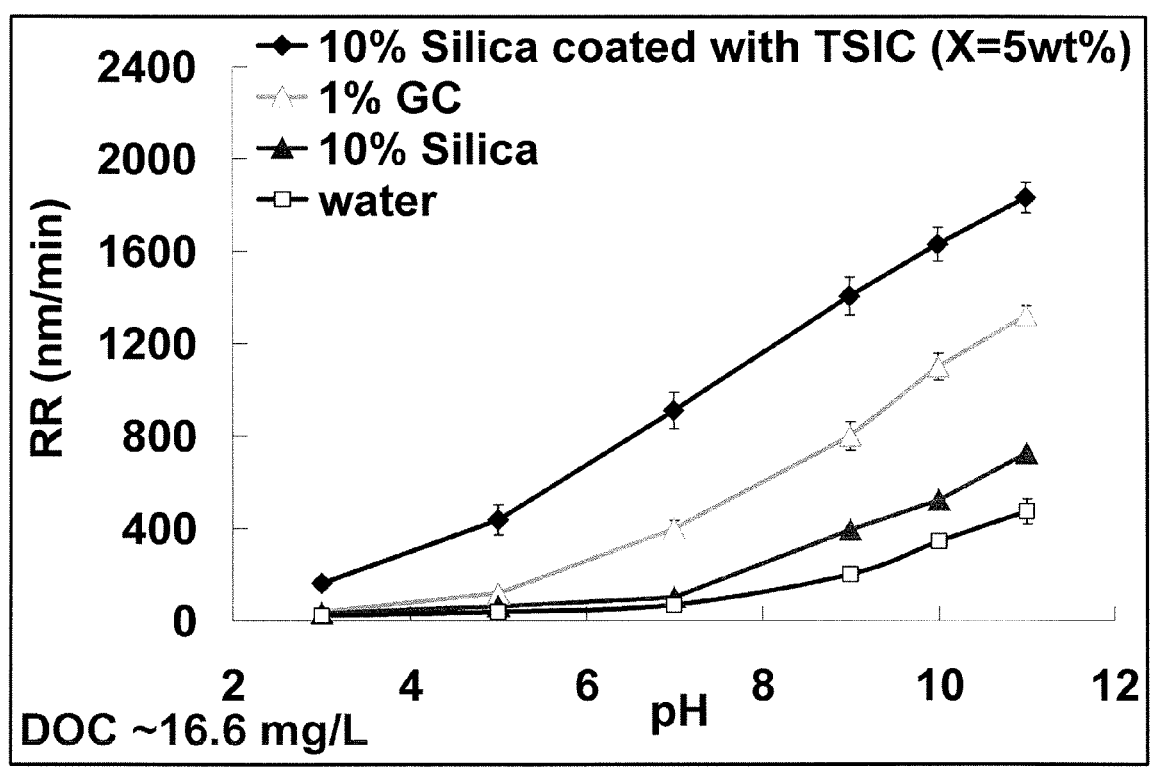
FIG. 4A is a graph of the removal rate of polysilicon films using abrasive-free solutions and silica-based dispersions as a function of pH at a dissolved oxygen content of ~16.6 mg/L.
Figure 4B:
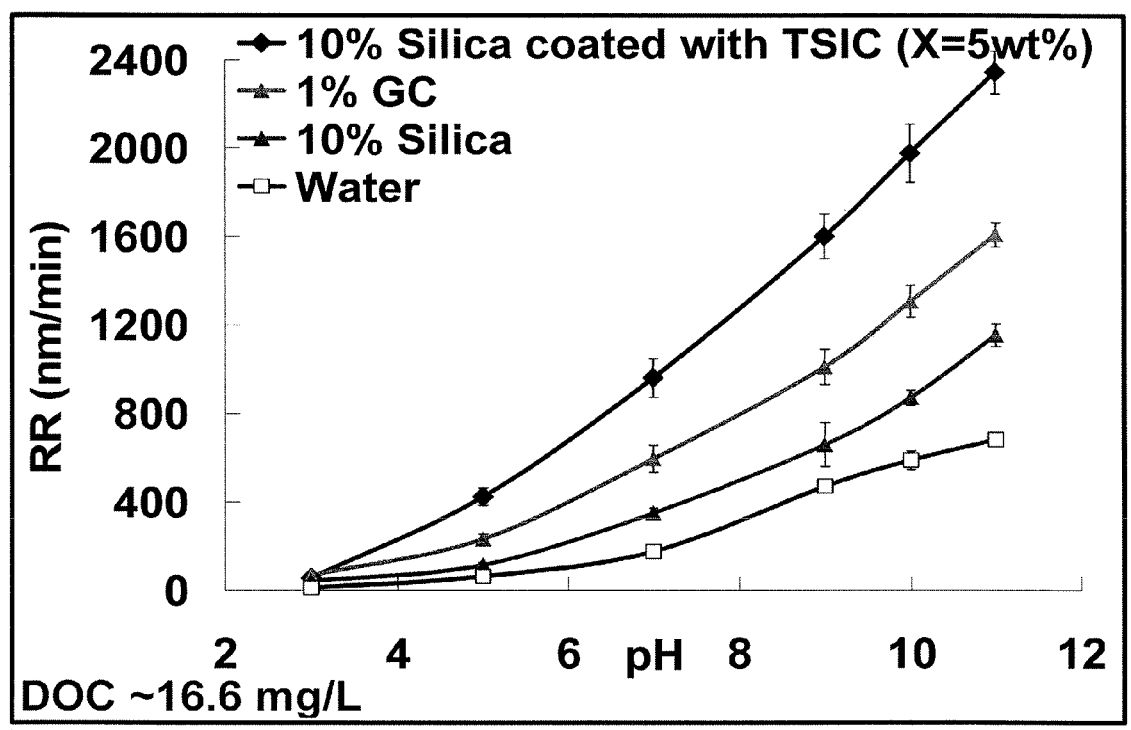
FIG. 4B is a graph of the removal rate of Si(100) films using abrasive-free solutions and silica-based dispersions as a function of pH at a dissolved oxygen content of ~16.6 mg/L.

FIGS. 4A and 4B depict polysilicon and Si(100) RRs obtained (under identical polishing conditions used in FIGS. 3A and 3B) using the same four polishing systems, but at an increased DOC of ~16.6 mg/L. The DOC was maintained at this value during polishing by allowing it first to stabilize at the higher level and then continuing the oxygen supply to the dispersion in the container. At the higher DOC, it was observed in all these cases that both the polysilicon film and Si(100) RRs increased as the pH was increased just as at the data in FIG. 3. More importantly, at the higher DOC level, the RRs almost doubled when compared to the RRs obtained with the same suspensions at the lower DOC (~8.6 mg/L) at all pH values.

Figure 5:
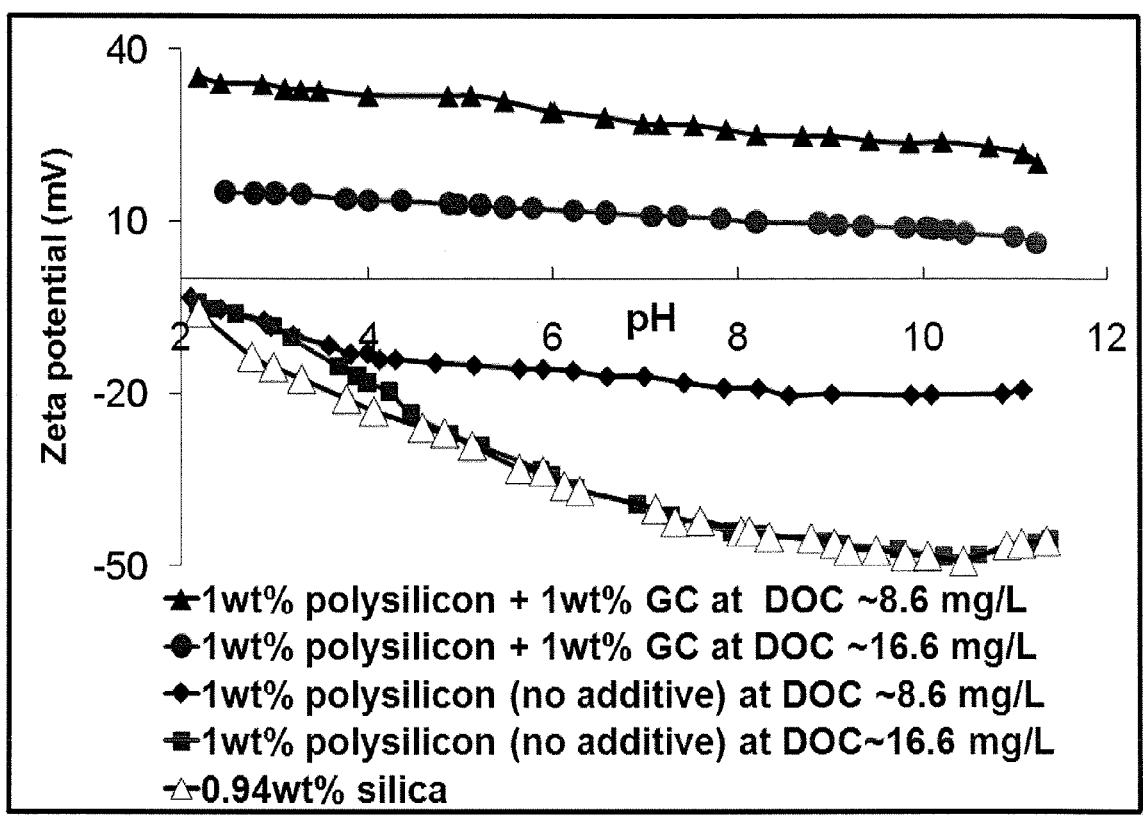
FIG. 5 is a graph of the zeta potential of 1 wt % polysilicon ($d_m$~270 nm) dispersion with and without 1 wt % guanidine carbonate at dissolved oxygen content ~8.6 mg/L and ~16.6 mg/L, and of 0.94 wt % silica-based dispersion, all as a function of pH.

Upon increasing the DOC to ~16.6 mg/L, the magnitude of the negative charge increased for pH>~4, as shown in FIG. 5. This can be ascribed to the formation of a thicker suboxide layer on the polysilicon powder surface, presumably due to the increased DOC, thereby increasing the negative charge. In fact, this surface is now closer to that of a silicon dioxide particle surface since its zeta potential is almost the same as that of silica particles in a dispersion containing approximately same size and number of polysilicon particles in the pH range ~4-12. It should be noted here that the zeta potentials of silica particles are independent of DOC.

Similarly, when GC was added to the polysilicon powder, the charge became less positive when the DOC was increased from ~8.6 mg/L to ~16.6 mg/L (FIGS. 4A and 4B). Apparently, even though GC binds to the polysilicon surface, it does not prevent enhanced oxide film growth that leads to a less positive charge. The RR enhancement obtained with GC is consistent with this. Based on the zeta potential measurements, it is proposed that higher formation sub oxide on polysilicon leads to higher polish rates.

Figure 6A:
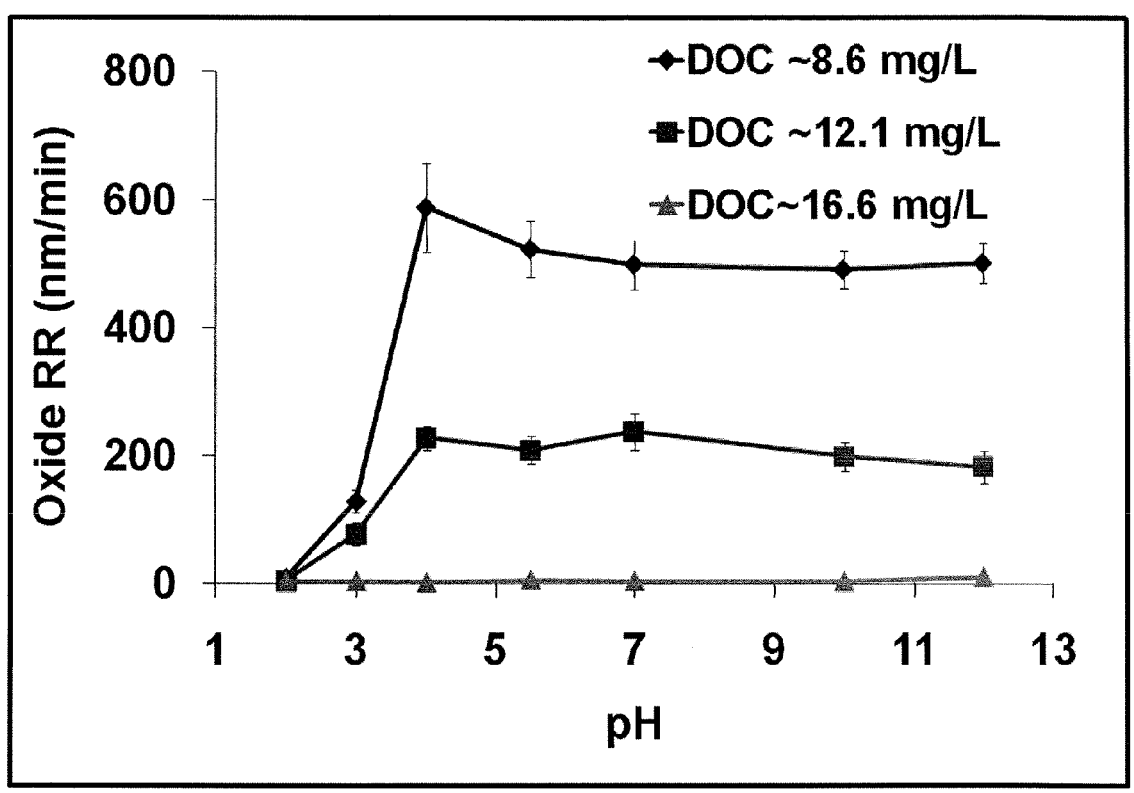
FIG. 6A is a graph of the removal rate of silicon dioxide films obtained using 1 wt % ceria-based dispersions as a function of pH at two dissolved oxygen content values (~8.6 mg/L and ~16.6 mg/L)
Figure 6B:
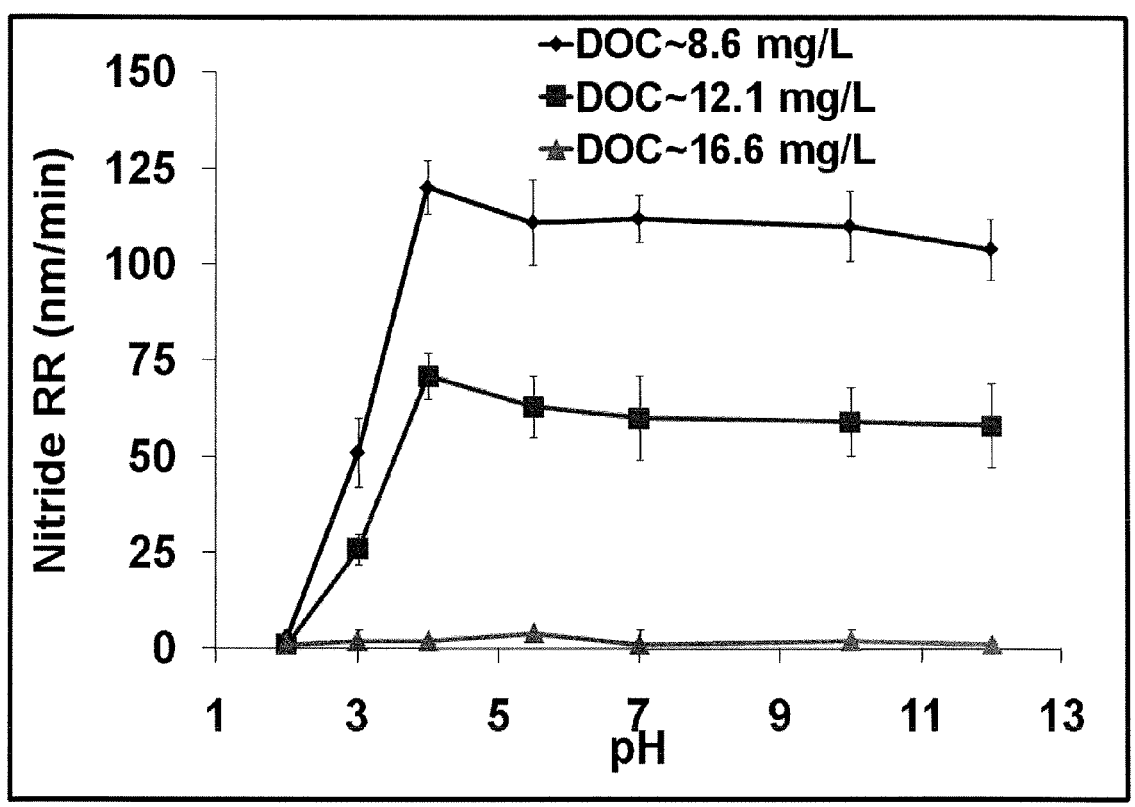
FIG. 6B is a graph of the removal rate of silicon nitride films obtained using 1 wt % ceria-based dispersions as a function of pH at two dissolved oxygen content values (~8.6 mg/L and ~16.6 mg/L)

FIGS. 6A and 6B depict the silicon dioxide and silicon nitride RRs, respectively, obtained using ceria-based dispersions at different pH and DOC values. When the DOC was increased, both the silicon dioxide and silicon nitride RRs still follow the same trend with pH (in the range 2-12) but dropped as the DOC in the polishing dispersion was increased. Even more interestingly, both the silicon dioxide and silicon nitride RRs were suppressed to <3-4 nm/min at the limiting DOC of ~16.6 mg/L. In addition, copper removal rates in all the investigated cases was <1 nm/min.

Example 3

Removal Rates of Silicon Dioxide and Silicon Nitride Film

Figure 8A:
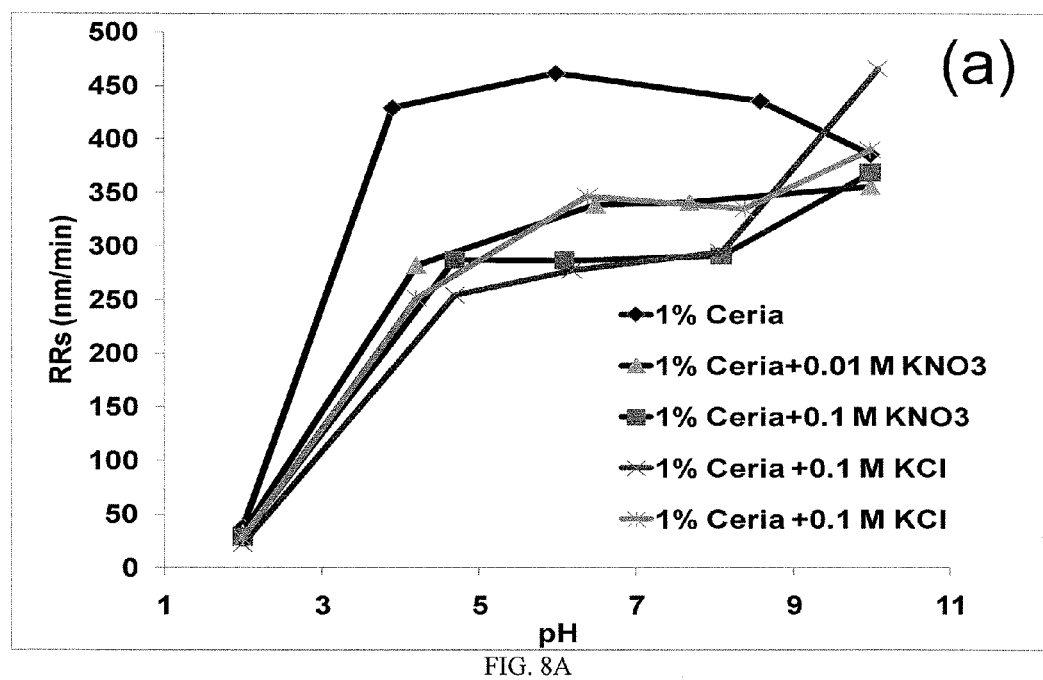
FIG. 8A is a graph of removal rates of silicon dioxide films with various ceria-based dispersions in the pH range 2-11.
Figure 8B:
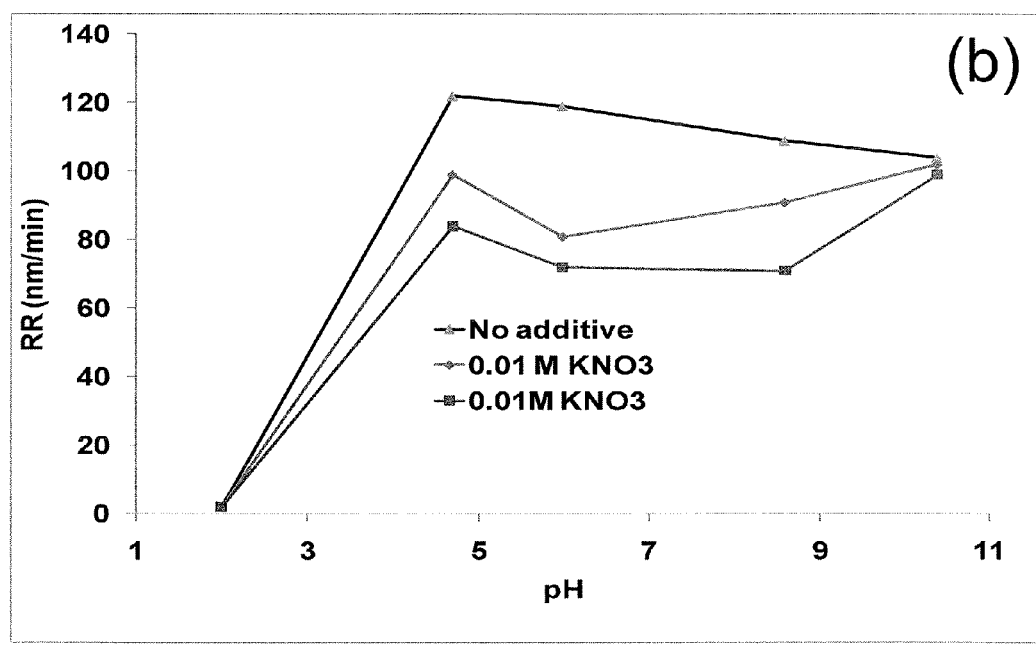
FIG. 8B is a graph of removal rates of silicon nitride films with various ceria-based dispersions in the pH range 2-11.

Both silicon dioxide and silicon nitride film removal rates ("RR"s) were obtained using 1 wt % ceria ($d_m$~180 nm)-based dispersions at different pH values. The results are depicted in FIGS. 8A and 8B. Interestingly, when the amount of KNO3 added to the ceria-based dispersions is increased from 0 to 0.1M, the oxide and nitride RRs still followed the same progression, but with different magnitudes. The higher the concentration, the higher the suppression of both oxide and nitride RRs.

Example 4

Zeta Potential

Figure 9:
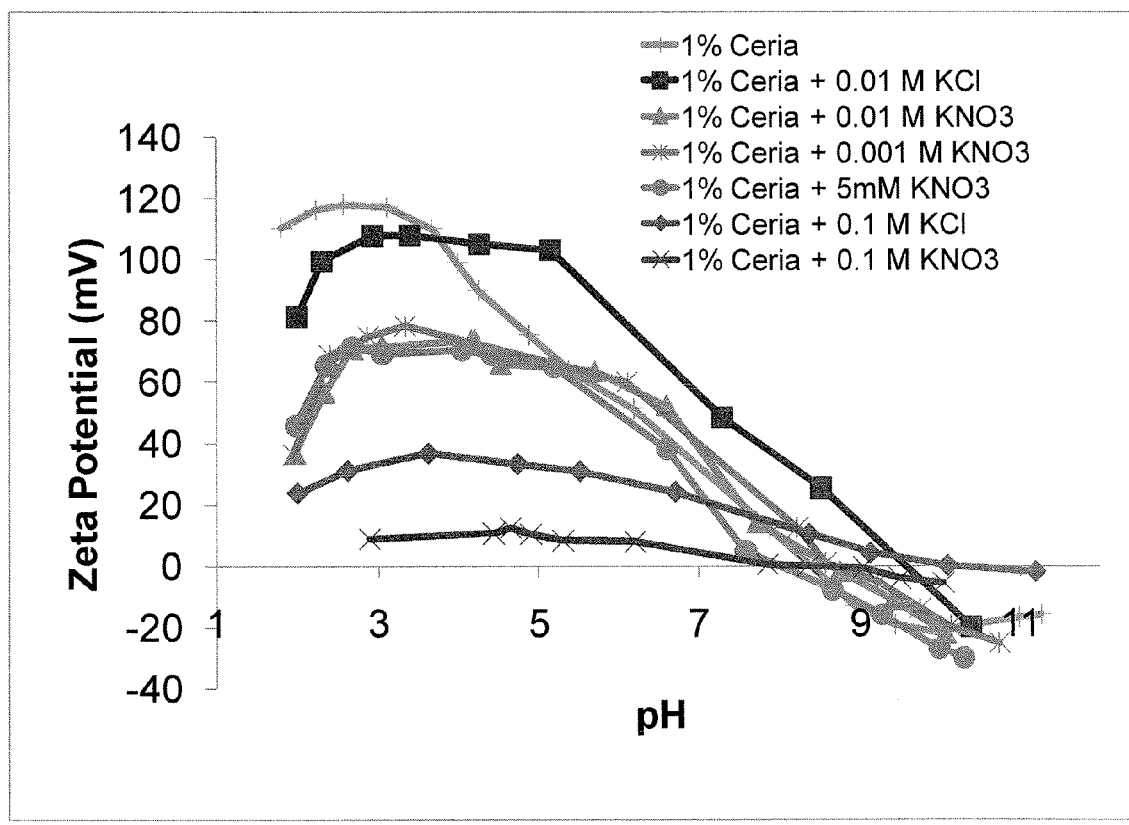
FIG. 9 is a graph of zeta Potentials of ceria with various additives as a function of pH.

FIG. 9 shows the zeta potential data of ceria in the absence and presence of KNO3 in the pH range 2-12. The isoelectric point ("IEP") of the ceria abrasives (with no additives) investigated here is ~8. When the concentration of potassium nitrate was increased from 0 to 0.1M, the magnitude of the charge also decreased significantly at pH<IEP, most likely due to electrostatic attraction and at other pH values, there is no significant change in the zeta potential values when these additives were added due to electrostatic repulsion.

Example 5

Thermogravimetric Analysis

Ceria abrasives obtained from the sediment after centrifuging, did show any significant weight loss even in the presence and absence of $KNO_3$. As observed from the zeta potential data, it seems that the binding of the anions to the ceria abrasive surface is purely electrostatic interaction and hence, we are unable to detect any significant weight loss in TGA (FIG. 10) because of the centrifuging and sedimentation.

Example 6

Oxygen Intake and Release

Figure 7:
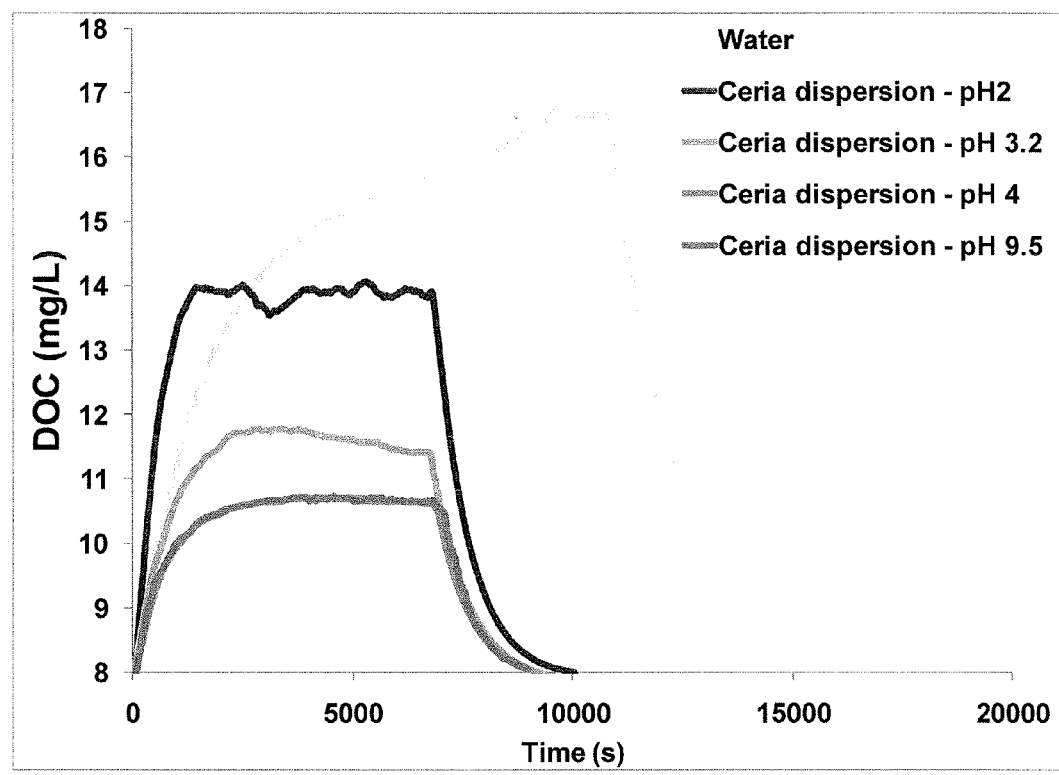
FIG. 7 is a graph of dissolved oxygen content ("DOC") as a function of time at an oxygen flow rate of ~19.6 cc/min bubbled into the water, and ceria dispersion at different pH values.

FIG. 7 shows the oxygen intake and release data obtained with 1 wt % ceria dispersion at different pH values in comparison to water (at any pH) when the oxygen flow rate was maintained at ~19.6 cc/min. It was observed that the time to reach a maximum DOC value or to get back to its initial value (~8 mg/L) using ceria abrasives at different pH values follows the same progression. Similar behavior was observed at an oxygen flow rate of ~14 cc/min. It seems that the $Ce^{3+}$ species present on the surface of the ceria abrasives is converted to $Ce^{4+}$ due to excess amount of oxygen available when DOC is increased and reversible i.e., $Ce^{4+}$ is converted back to $Ce^{3+}$ when the DOC starts decreasing. Most likely, based on TGA and zeta potential data, the nitrate ions adsorption on the ceria abrasives at pH<IEP also follow the following order:

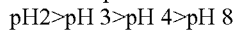

pH2>pH 3>pH 4>pH 8

In fact, others have shown that the conversion of $Ce^{3+}$ to $Ce^{4+}$ on the surface of ceria abrasives is reversible by changing the ambient conditions. For example, it has been proposed that this conversion process "is reversible as soon as the external conditions change from oxygen poor to oxygen rich". More importantly, others have shown that the exposure of ceria film at room temperature resulted in nearly complete conversion of $Ce^{3+}$ on the surface to $Ce^{4+}$. The time consumed by the ceria abrasives both for oxygen release and intake in the pH range 4-9.5 is higher when compared to the other pH values since the number of active $Ce^{3+}$ species increase as the pH increases. All these results are consistent with the zeta potential and UV-Visible absorbance data.

In addition, others observed that both the silicon dioxide and silicon nitride RRs were suppressed to <3 nm/min when polished using ceria-based dispersions in the presence of an oxidizing agent ($H_2O_2$). They proposed that this RR suppression might be due to the conversion of $Ce^{3+}$ on the surface of the ceria abrasives to $Ce^{4+}$, supported by Zhang et al. All these observations are consistent with our proposed mechanism that the reactive species on the surface of the ceria abrasive is $Ce^{3+}$.

Example 7

Mechanism of Silicon Dioxide or Silicon Nitride Removal Using Ceria-Based Dispersions It was found that both the silicon dioxide and silicon nitride films RR trend, increase in the number of $Ce^{3+}$ sites on the ceria abrasives, change in zeta potential of ceria abrasives in the presence of anions, and oxygen intake and release trends of ceria abrasives at different pH values follow the same progression. Hence, based on all these results it is plausible to say that it is the $Ce^{3+}$ on the surface of the ceria abrasives that reacts with silicon dioxide surface or the suboxide on the silicon nitride surface. However, it has been proposed that "cerous has less effect to polish and easy to adhere, while ceria polishes $SiO_2$ quick and easy to be removed." The reason for this is explained as follows.

Figure 10:
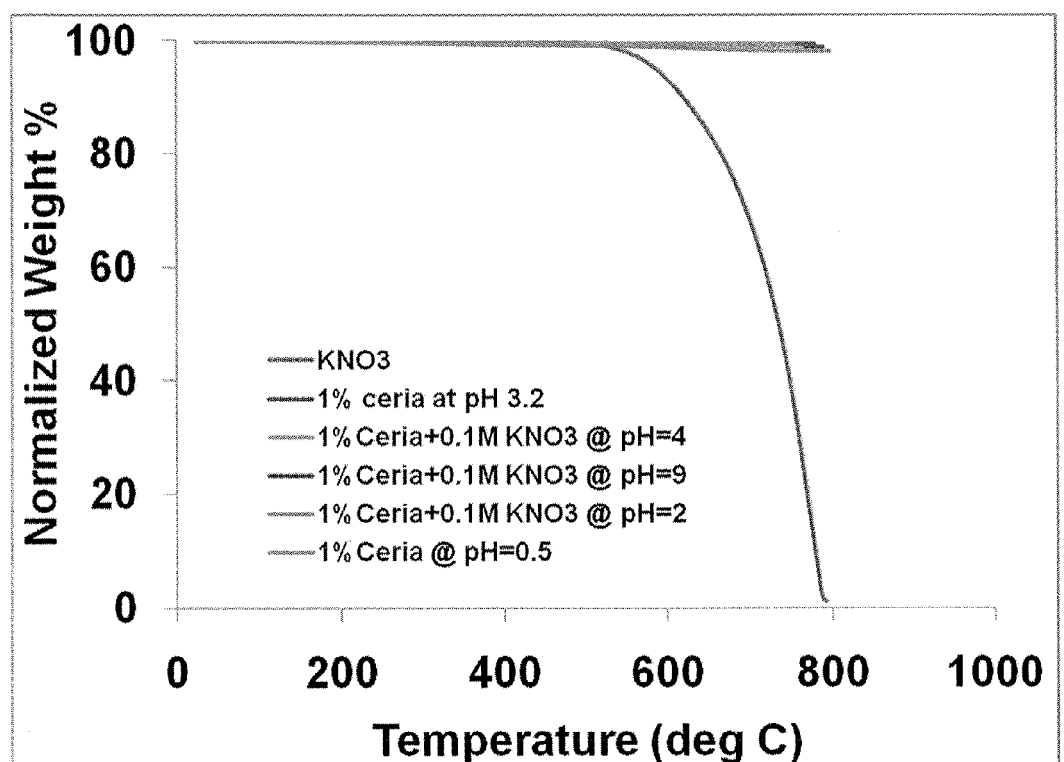
FIG. 10 is a graph of a thermo gravimetric analysis of ceria with various additives.
Figure 11:
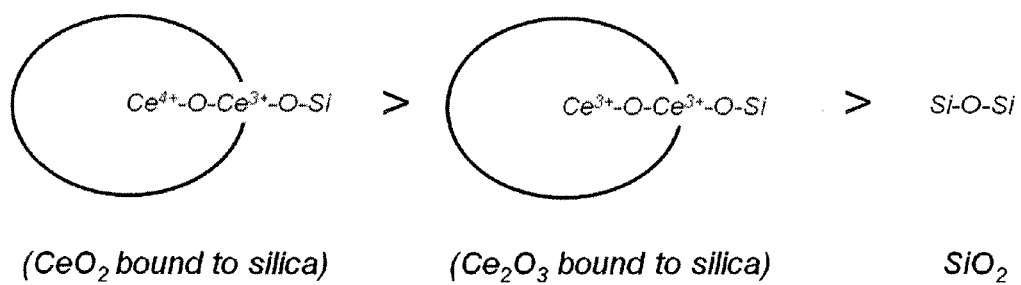
FIG. 11 is a schematic representation of the strength of the structures formed by the binding of $Ce^{3+}$ adjacent to another $Ce^{3+}$.

Generally, ceria particles were synthesized using $Ce^{3+}$ or $Ce^{4+}$ salts as precursors by several methods. During this synthesis, unstable $CeO_{2-x}$ ($0<x<2$) particles formed will be subjected to calcination at higher temperatures to convert the entire $Ce^{3+}$ to $Ce^{4+}$. Indeed, this conversion efficiency depends on several parameters, like particle size, processing parameters, ambience, impurities, etc, which lead to the presence of a few to 100% active $Ce^{3+}$ sites on the surface of the ceria abrasives. It seems that the strength of the structures formed by the binding of $Ce^{3+}$ adjacent to another $Ce^{3+}$, in case of $Ce_2O_3$ particles, or $Ce^{4+}$, in case of $CeO_2$ particles, with silicon dioxide in comparison with Si—O—Si structures is as shown in FIG. 10.

Since ceria particle can pull the bound silicon dioxide much easier that $Ce_2O_3$, the former gives high removal rates than the later and perhaps, this might be reason for which $Ce_2O_3$ causes more residual defects when compared to $CeO_2$.

In addition, it has been observed that there are three different $O_2^-$ ($O_2$, $O^2-$, $O_2^{2-}$) species with three different coordination arrangements on Ce sites. Out of these three, only one was sensitive to the presence of oxygen vacancies and is tentatively identified to be the end-on coordinated $O_2-$ species. More recently, it was also proposed that several additives which suppress both silicon dioxide and silicon nitride removal rates bind to the reactive species, presumably $Ce^{3+}$, on the ceria abrasives with end-on coordination forming a β-biketonate complex. Since the RR trend for both silicon dioxide and silicon nitride films, and oxygen intake and release data follow the same trend at different pH values, it is most likely that it is the $Ce^{3+}$ with end-on coordination that reacts with silicon dioxide or suboxide on the silicon nitride surface. This is consistent with earlier proposals supported by zeta potential (FIG. 9), oxygen intake and release (FIG. 7), and removal rate data.

Materials

Two inch diameter blanket thermal oxide (grown at ~900° C.) and silicon nitride (low pressure chemical vapor deposited at ~790° C.) wafers, with an initial thickness of ~2000 nm and ~500 nm, respectively, were purchased from a commercial source. The silicon nitride wafers had a ~100 nm thick intervening layer of $SiO_2$ between the silicon nitride film and the Si substrate. Ceria ($d_m$~180 nm) dispersions were obtained from a commercial source.

Chemical-Mechanical Polishing Experiments

The polishing experiments were carried out using a bench top CETR polisher. The polishing conditions were typically 4 psi operating pressure/retaining ring pressure, 75/75 rpm carrier/platen speed, and a dispersion flow rate of ~90 ml/min. The polishing pad (IC-1000, k-groove) was conditioned (ex-situ) using a diamond-grit pad conditioner (obtained from 3M® Inc.). Two wafers each of silicon dioxide and silicon nitride were polished for each condition. The RRs were calculated from the difference in the film thickness, measured using a Filmetrics® F-20 interferometer, before and after polishing, at 16 points across the wafer. The standard deviation of the RR was also determined using these data.

Dissolved Oxygen Content

Using the experimental design depicted in FIG. 1, pure oxygen (99.99%) from a gas cylinder was continuously supplied at the bottom of a 2000 ml container using a perforated PVC tube while stirring the suspension in the container with a stirrer rotated at ~900 rpm. The DOC in the polishing suspension was measured every 15 seconds using a Hach (HQ30d) probe meter. It was observed that the DOC value increased from its initial value of ~8.6 mg/L (over the pH range 2-12) to a limiting value of ~16.6 mg/L, independent of pH, over ~5 minutes and did not increase further even after 30 minutes as more oxygen was supplied. Accordingly, the polishing experiments were conducted at DOC of ~8.6 mg/L and ~16.6 mg/L.

In the second series of experiments, pure oxygen (99.99% pure) from an oxygen gas cylinder was continuously supplied for a few minutes at the bottom of the container in which ~2000 ml of ceria dispersions were stirred at ~900 rpm, as shown, for example, in FIG. 7. The oxygen flow rate was maintained at ~19.6 cc while the DOC in these dispersions was measured at certain intervals using a Hach (HQ30d) probe meter. It was observed that the initial DOC in our deionized water is ~8 mg/L over the pH range 2-12, reached a maximum level after certain time and did not increase further with continued oxygen supply.

Zeta Potentials

Zeta potentials were measured using a Matec Applied Science Model 9800 Electro acoustic analyzer. The concentration of ceria (dmean ~180 nm) particles in the sample, same as the abrasive concentration in the polishing dispersions used here. Each sample was prepared by first dissolving the additives, if any, in a small amount of deionized water, followed by the addition of the ceria particles, as the case may be, and finally making up of the volume to 200 ml. The samples were stirred well for ~15 min before use. The samples were titrated with KOH or $HNO_3$ to vary the pH.

Although the present invention has been described in connection with a preferred embodiment, it should be understood that modifications, alterations, and additions can be made to the invention without departing from the scope of the invention as defined by the claims.

What is claimed is:

1. A method for selectively removing a target material on a surface of a substrate, the method comprising the steps of:
   providing a substrate comprising a target material and a non-target material;
   dissolving oxygen in a polishing solution to achieve a pre-determined dissolved oxygen concentration, the polishing solution having a pH of from about 5 to about 11, wherein the polishing solution comprises a plurality of abrasive silica particles, at least some of said plurality of abrasive silica particles are functionalized with n-(trimethoxysilylpropyl)isothiouronium chloride;
   maintaining, by continuously applying substantially pure oxygen to said polishing solution, the pre-determined dissolved oxygen concentration of said polishing solution at or between approximately 8.6 mg/L and approximately 16.6 mg/L;
   disposing the polishing solution between a polishing pad and the surface;
   applying the polishing pad to the surface; and
   selectively removing a predetermined thickness of the target material;
   wherein varying the dissolved oxygen content of the polishing solution varies the removal ratio of target material to non-target material during the removal step.

2. The method of claim 1, wherein the step of dissolving oxygen in a polishing solution to achieve a pre-determined oxygen concentration comprises the steps of:
- applying substantially pure oxygen to said polishing solution;
- stirring said polishing solution until said pre-determined dissolved oxygen concentration is achieved; and
- determining the dissolved oxygen concentration of the polishing solution.

3. The method of claim 1, wherein the plurality of abrasive particles comprise a compound selected from the group consisting of ceria, zirconia, titania, alumina, germania, chromium dioxide, manganese di dioxide, and combinations thereof.

4. The method of claim 1, wherein said polishing solution further comprises an additive.

5. The method of claim 4, wherein said additive is selected from the group consisting of amines, amino acids, and combinations thereof.

6. The method of claim 1, wherein varying the pH of the polishing solution further varies the removal ratio of target material to non-target material during the removal step.

\* \* \* \* \*